(12) United States Patent
Park et al.

(10) Patent No.: US 9,612,134 B2
(45) Date of Patent: Apr. 4, 2017

(54) METHOD OF SENSING SLIDING BY HALL SENSOR AND SENSING SYSTEM USING THE SAME

(71) Applicant: Magnachip Semiconductor, Ltd., Cheongju-si (KR)

(72) Inventors: Seung-hwan Park, Cheongju-si (KR); Hyung-nam Jin, Sejong-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 284 days.

(21) Appl. No.: 14/198,165

(22) Filed: Mar. 5, 2014

(65) Prior Publication Data
US 2015/0061648 A1 Mar. 5, 2015

(30) Foreign Application Priority Data
Aug. 29, 2013 (KR) .................. 10-2013-0103458

(51) Int. Cl.
*G01R 33/07* (2006.01)
*G01B 7/14* (2006.01)
*G01D 5/14* (2006.01)
*G01B 7/00* (2006.01)

(52) U.S. Cl.
CPC ............. *G01D 5/145* (2013.01); *G01B 7/003* (2013.01); *G01R 33/07* (2013.01); *G01B 7/14* (2013.01)

(58) Field of Classification Search
CPC ................... G01R 33/07; G01B 7/14
See application file for complete search history.

(56) References Cited

U.S. PATENT DOCUMENTS

| 2,942,177 | A | * | 6/1960 | Neumann | G01R 33/07 324/228 |
| 4,373,271 | A | * | 2/1983 | Nitz | G01C 17/28 324/251 |
| 5,091,697 | A | * | 2/1992 | Roth | G01R 33/045 324/247 |
| 6,442,011 | B1 | * | 8/2002 | Attarian | G01R 15/202 324/117 H |
| 8,847,979 | B2 | * | 9/2014 | Smith | G06F 3/01 345/169 |
| 2001/0050557 | A1 | * | 12/2001 | Kempe | G01R 33/07 324/251 |
| 2004/0130317 | A1 | * | 7/2004 | Hatanaka | G01R 33/07 324/207.2 |
| 2009/0251316 | A1 | * | 10/2009 | Mamourian | G08B 3/10 340/540 |
| 2009/0284252 | A1 | * | 11/2009 | Burgdorf | G01D 5/2451 324/207.2 |
| 2014/0097835 | A1 | * | 4/2014 | Sartee | G01R 33/07 324/251 |
| 2014/0320114 | A1 | * | 10/2014 | Enkovaara | G05B 19/042 324/207.11 |

(Continued)

FOREIGN PATENT DOCUMENTS

KR 20-1999-70035804 12/1997

*Primary Examiner* — Jermele M Hollington
(74) *Attorney, Agent, or Firm* — NSIP Law (57) ABSTRACT

A method of sensing a sliding by a sensor including grouping one or more Hall elements into one or more groups, measuring magnetic field strength generated by a magnetic field source, and comparing the magnetic field strength at the one or more Hall elements to determine whether a horizontal sliding occurs.

10 Claims, 6 Drawing Sheets

(56) References Cited

U.S. PATENT DOCUMENTS

| | | | |
|---|---|---|---|
| 2015/0035517 A1* | 2/2015 | Blackmer | G01D 5/145 324/207.2 |
| 2015/0042318 A1* | 2/2015 | Youm | G01R 35/00 324/202 |
| 2015/0316394 A1* | 11/2015 | Kim | G01D 5/145 324/207.2 |
| 2016/0097823 A1* | 4/2016 | Feldmeier | G01R 33/0029 324/251 |

* cited by examiner

METHOD OF SENSING SLIDING BY HALL SENSOR AND SENSING SYSTEM USING THE SAME

CROSS-REFERENCE TO RELATED APPLICATIONS

This application claims the benefit under 35 USC 119(a) of Korean Patent Application No. 10-2013-0103458 filed on Aug. 29, 2013, in the Korean Intellectual Property Office, the entire disclosure of which is incorporated herein by reference for all purposes.

BACKGROUND

1. Field

The following description relates to a method of sensing a sliding by a Hall sensor and a sensing system using the same.

2. Description of Related Art

The Korean Utility Model Registration No. 20-0167871 relates to a device of sensing whether a flip cover of a flip-type cordless phone opens or closes and describes an idea including a PCB (Printed Circuit Board), a magnetic sensor and a flip cover. The PCB is installed inside of a body and is accessible through a selection button. The magnetic sensor detects a magnetic power at the bottom of the PCB to control a power supply of the device. Accordingly, related art is limited in its capacity of detecting motion of a flip cover. For example, related art does not describe sensing whether a horizontal sliding of a flip cover from a surface of a terminal device occurs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of sensing a sliding by a sensor includes arranging one or more Hall elements; arranging a magnetic field source configured to generate a magnetic field; grouping the one or more Hall elements into one or more groups; and measuring, using the one or more Hall elements, magnetic field strength generated by the magnetic field source.

The method may further include comparing the magnetic field strength generated at the one or more Hall elements; determining whether a horizontal sliding occurs, wherein the arranging one or more Hall elements comprises arranging one or more Hall elements on a first body; the arranging a magnetic field source comprises arranging the magnetic field source on a second body corresponding to the first body; and the determining whether a horizontal sliding occurs comprises determining whether a horizontal sliding of the second body from the surface of the first body occurs.

The comparing the magnetic field strength may include checking a similarity of the magnetic field strength generated at the one or more Hall elements.

The checking a similarity may include determining a ratio of a magnetic field strength collected from a first Hall element to a magnetic field strength collected from a second Hall element of a group.

The comparing the magnetic field strength may further include measuring a standard deviation of the magnetic field strength.

The determining whether a horizontal sliding of the second body from a surface of the first body occurs may include determining that a sliding of the second body does not occur in response to the similarity and the standard deviation satisfying a threshold.

The determining whether a horizontal sliding of the second body from a surface of the first body occurs may include determining that a sliding of the second body occurs in response to one of the similarity and the standard deviation not satisfying a threshold.

A threshold of the similarity may range from about 0.5 to about 1.5.

A threshold of the standard deviation may range from about 0 to about 0.5.

The first body may include a terminal including a sensor chip.

The second body may include a flip cover including a magnet.

The one or more groups may be determined using a distance between the magnetic field source and the one or more Hall elements.

In another general aspect, a sensing device includes one or more Hall elements configured to collect an external magnetic field strength; a similarity measurement unit configured to measure a similarity of the magnetic field strength; and a standard deviation measurement unit configured to measure a standard deviation of the magnetic field strength.

The device may further include a checking unit configured to check whether one of the similarity and the standard deviation is satisfied; and a determination unit configured to determine whether a horizontal sliding of a cover from a surface comprising the one or more Hall elements occurs.

The determination unit may be configured to determine that a sliding of the second body does not occur in response to the similarity and the standard deviation satisfying a threshold.

The determination unit may be configured to determine that a sliding of a second body occurs in response to one of the similarity and the standard deviation not satisfying a threshold.

A threshold of the similarity may range from about 0.5 to about 1.5.

A threshold of the standard deviation may range from about 0 to about 0.5.

In another general aspect, a device for sensing a horizontal sliding of a cover may include one or more Hall elements arranged on the device and configured to detect magnetic field strength generated by a magnetic field source on the cover; a grouping unit configured to group the one or more Hall elements into one or more groups; and a determination unit configured to determine whether a horizontal sliding of the cover occurs.

The determination unit may be configured to determine whether a horizontal sliding of the cover occurs by comparing a similarity and a standard deviation of the one or more Hall elements of the one or more groups with a similarity threshold and a standard deviation threshold.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Figure 1:
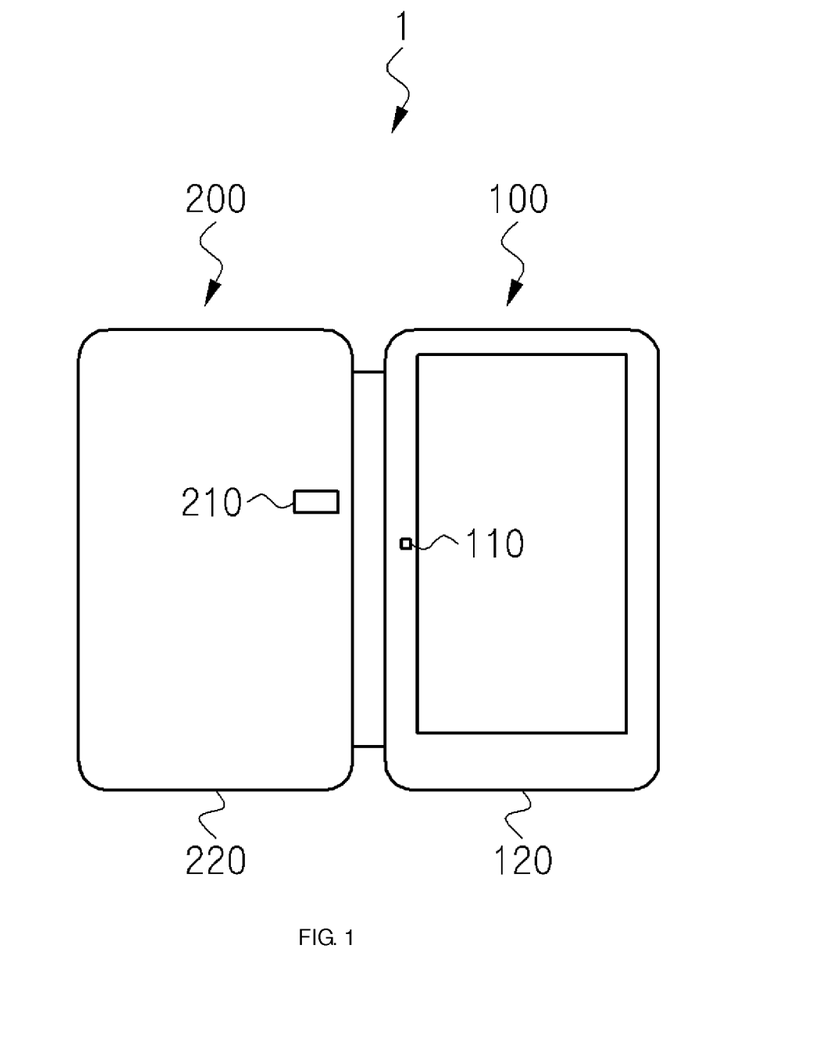
FIG. 1 is a diagram illustrating an example of a display terminal and a flip cover.

FIG. 1 is a diagram illustrating an example of an electronic device including a display terminal and a flip cover.

Referring to FIG. 1, the electronic device 1 includes a first body 100 and a second body 200. The first body 100 may correspond to a display terminal. For convenience's sake, the first body 100 may be referred to as the display terminal 100. The display terminal 100 includes a Hall sensor 110 and a main body 120. The second body 200 may correspond to a flip cover 200. For convenience's sake, the second body 200 may be referred to as the flip cover 200. The flip cover 200 may include a magnet 210 and a covering unit 220. Herein, the display terminal 100 and the flip cover 200 are only named after their respective functions and, in other examples, the display terminal 100 and the flip cover 200 may be integrally implemented. That is, the flip cover 200 may be directly coupled to the display terminal 100 or to a backside battery cover.

The display terminal 100 may correspond to a wireless communication device such as a cellphone, a smartphone and a two-way radio. The display terminal 100 may include a Hall sensor (i.e., sensor chip) 110 and a main body 120.

Figure 4:
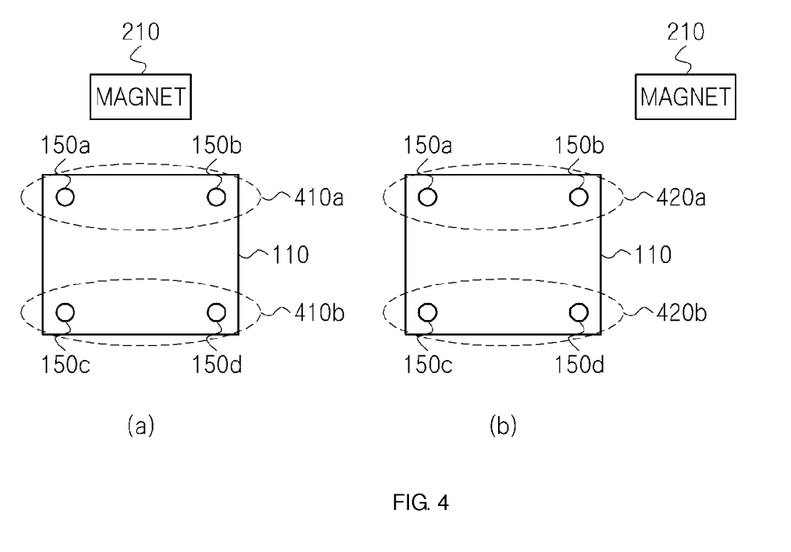
FIG. 4 is a diagram illustrating an example of a procedure of classifying at least one Hall element group.

The Hall sensor 110 may sense a magnetic field generated by the magnet 210 of the flip cover 200. The Hall sensor 110 may be rectangular in shape and may include at least one Hall element at each corner. In one example, as illustrated in FIG. 4, the Hall sensor 110 includes a single Hall element at each corner. In another example, the Hall sensor 110 includes two or more elements at each corner. The Hall sensor 110 may be referred to as a sensor chip. In other words, the Hall sensor 110 may include a single Hall element or two or more Hall elements at each corner. When two Hall elements are arranged at each corner, the Hall sensor 110 may include eight Hall elements in total.

The main body 120 may include a display device and a wireless transceiver.

The flip cover 200 may correspond to a cover capable of protecting a display and appearance of a display terminal 100 and especially, protects the display terminal 100 from scratches or damage resulting from dropping. The flip cover 200 may include a magnet 210 generating a magnetic field and a covering unit 220 covering a front of the display terminal 100. The opening or closing of the flip cover 200 or a horizontal sliding of the flip cover 200 may generate a variation of the magnetic field which may be detected through the Hall sensor 110 of the display terminal 100. For example, the horizontal sliding corresponds to a movement of the flip cover 200 generated by an external force in the horizontal direction with a surface of the display terminal 100 or the Hall sensor 110.

The magnet 210 generates a magnetic field around the Hall sensor 110. The magnet 210 is coupled or attached to the covering unit 220 to be moved according to a movement of the covering unit 220, and the magnetic field around the Hall sensor 110 is changed according to the movement of the covering unit 220.

The covering unit 220 protects a front of the display terminal 100 and may internally or externally include the magnet 210. The magnet 210 may generate a magnetic field as a magnetic field source.

Figure 2:
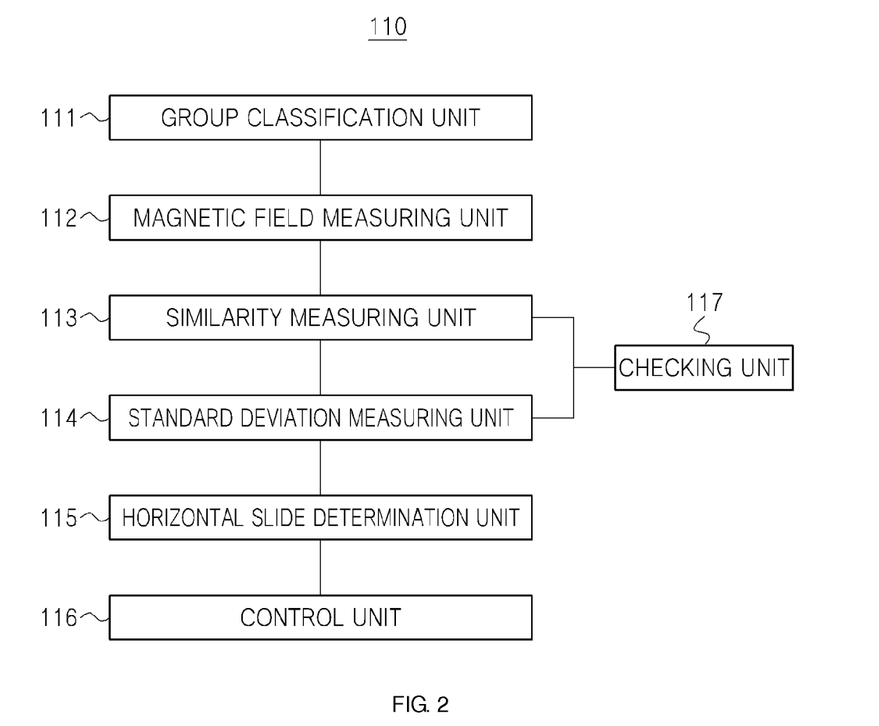
FIG. 2 is a diagram illustrating an example of a Hall sensor (or a sensor chip).

FIG. 2 is a block diagram illustrating an example of a Hall sensor.

Referring to FIG. 2, the Hall sensor 110 includes a group classification unit 111, a magnetic field strength measurement unit 112, a similarity measuring unit 113, a standard deviation measuring unit 114, a checking unit 117, a horizontal sliding determination unit 115, and a control unit 116.

The group classification unit 111 may classify the at least one Hall element 150 into groups based on a distance between each of the at least one Hall element 150 and the magnet 210. Each of the groups may be determined based on a distance between the magnet 210 and the at least one Hall element 150. The group classification unit 111 may pre-assign each of the at least one Hall element 150 into the groups. As illustrated in FIG. 4a, for example, when the four Hall elements 150 are respectively arranged in a corner of the Hall sensor 110, the first group 410a includes two Hall elements 150a, 150b near the magnet 210 and the second group 410b includes two Hall elements 150c, 150d far from the magnet 210. That is, the first Hall group 410a includes a first Hall element 150a and a second Hall element 150b. The first Hall element 150a and the second Hall element 150b are similarly apart from the magnet 210, so the Hall elements may sense a similar magnetic field strength. From the perspective of the magnet 200, the first and second Hall elements are apart from the magnet 210 by a substantially equal distance and detect a similar magnetic field strength.

Likewise, the second group 410b includes a third Hall element 150c and a fourth Hall element 150d. In this example, when the magnetic field strength is compared between the first group 410a and the second group 410b, a magnetic field of the first group 410*a* is stronger than a magnetic field of the second group 410*b*.

Figure 3:
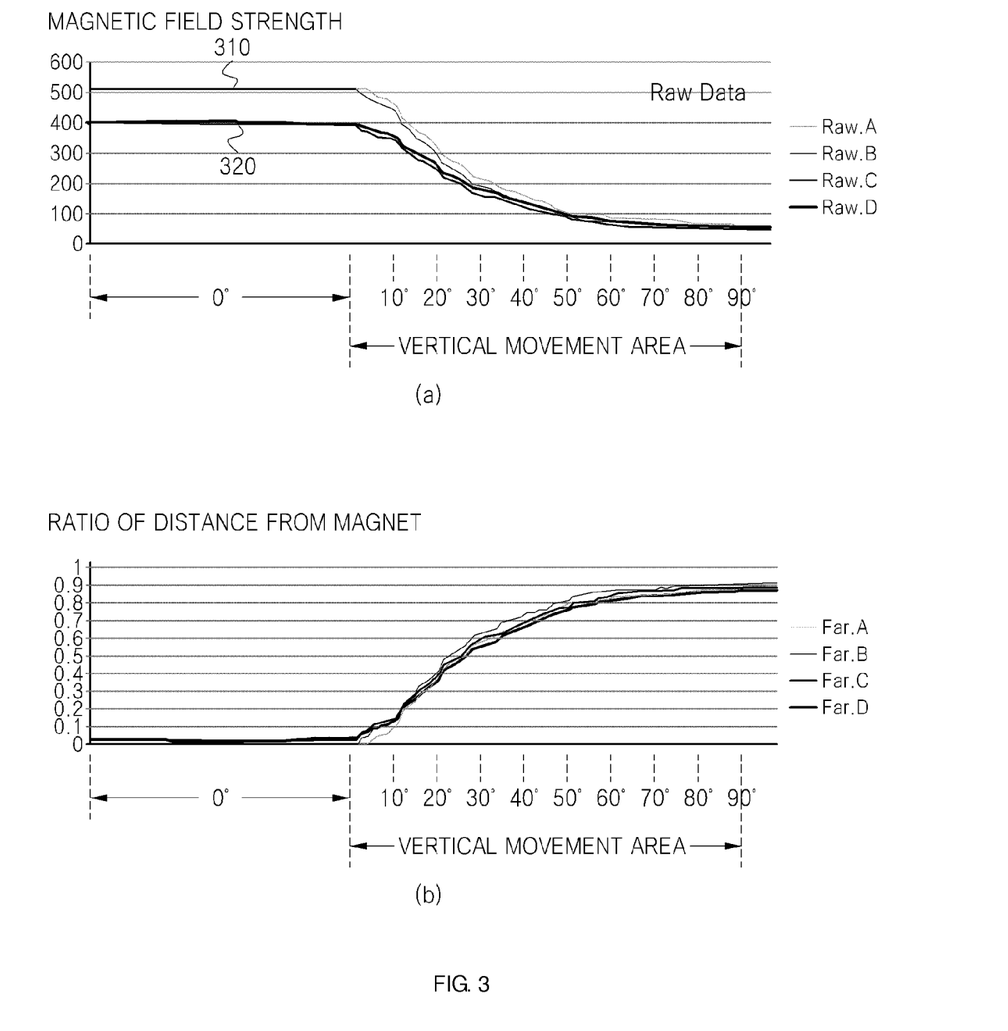
FIG. 3 is a diagram illustrating an example of a collection of magnetic field strengths by at least one Hall element.

FIG. 3 is a diagram illustrating an example of a collection of magnetic field strengths by at least one Hall element.

In FIG. 3*a*, a line 310 indicates a magnetic field strength detected by the first group 410*a* of FIG. 4(*a*), and a line 320 indicates a magnetic field strength detected by the second group 410*b* of FIG. 4(*a*). The magnetic field strength detected by the first group is stronger than that detected by the second group because the distance between the magnet 210 and the first group is nearer than that between the magnet 210 and the second group. The magnetic field strength detected by each of the Hall elements in the first group is substantially the same. Therefore, the similarity measuring unit 113 measures and compares the similarity between the Hall elements in the same group. It is not necessary to compare the similarity of the first and second groups because the magnetic field strength of the magnetic field detected by the first and second groups is different. Each of the at least one of Hall element may be pre-assigned to a specific group because the magnet 210 is stationary in the flip cover 200.

FIG. 4 illustrates two examples; in a first example, the horizontal sliding of the Hall sensor 110 does not occur and, in a second example, the horizontal sliding of the Hall sensor 110 occurs. For example, the horizontal sliding of the Hall sensor 110 does not occur in FIG. 4*a* and the horizontal sliding of the Hall sensor 110 may occur in FIG. 4*b*. Referring to FIG. 4*a*, the similarity between the Hall elements in the first group is high. Referring to FIG. 4*b*, the magnet 210 moves near the Hall element 150*b* due to a horizontal sliding of the flip cover 200. In this example, the magnetic field strength of the first and second Hall elements 150*a* and 150*b* in the first group may be changed and the similarity threshold may be deviated. Likewise, a magnetic field strength of the third and fourth Hall elements 150*c* and 150*d* in the second group may be changed and the similarity threshold may be deviated.

Referring again to FIG. 2, the magnetic field strength measuring unit 112 measures a magnetic field strength and a magnetic field direction generated by the magnet 210 of the flip cover 200. The magnetic field strength measuring unit 112 may be implemented as the Hall element 150. It should be appreciated that the Hall Effect is the production of a voltage difference (the Hall voltage) across an electrical conductor, transverse to an electric current in the conductor and a magnetic field perpendicular to the current. The Hall voltage is proportional to an amount of the electric current and the magnetic field strength and when the amount of the electric current is constant, the Hall voltage is proportional to the magnetic field strength. The magnetic field strength measuring unit 112 measures the magnetic field strength generated by the magnet 210.

The checking unit 117 checks the magnetic field strength at each Hall element by comparing the magnetic field strength of each of the measured values measured by the magnetic field strength measuring unit 112. The checking unit 117 compares the magnetic field strengths with each other to check whether a similarity and a standard deviation satisfy a certain criterion. Therefore, the checking unit 117 may include the similarity measuring unit 113 and the standard deviation measuring unit 114. The similarity measuring unit 113 measures and compares a similarity of the magnetic field strength at the at least one Hall element 150 and the standard deviation measuring unit 114 measures and compares a standard deviation of the magnetic field strength at the at least one Hall element 150.

The similarity measuring unit 113 may determine a similarity between the Hall elements in each of the groups. For example, the similarity measuring unit 113 may measure a similarity between the Hall elements in a specific group. That is, the similarity indicates a degree where the magnetic field strength at the Hall elements in each of the groups is similar and the similarity may satisfy the following Mathematical Equation 1.

$$\text{Similarity} = HA/HB \qquad \text{[Mathematical Equation 1]}$$

HA: Magnetic field strength of Hall Element A
HB: Magnetic field strength of Hall element B Assuming that the first Hall element and the second Hall element are included in the first group, and a value of the magnetic field strength of the first Hall element corresponds to HA and a value of the magnetic field strength of the second Hall element corresponds to HB, the similarity may correspond to a value of 1 when the value of HA and HB is measured at 500 mT, respectively. In another example, the similarity corresponds to a value of 0.943 when the value of HA is measured 500 mT and the value of HB is measured 530 mT. The closer the similarity ratio is to a value of 1, the more similar the variation of the magnetic field of the Hall elements A and B are.

As illustrated in FIG. 4*b*, when the horizontal sliding occurs, the magnetic field strength of the first Hall element 150*a* and the second Hall element 150*b* in the first group may be changed. Therefore, when the horizontal sliding occurs, the horizontal sliding determination 115 may determine that the flip cover is abnormally opened. Likewise, the same effect can be detected using the second group.

In FIG. 2, the standard deviation measuring unit 114 may determine a standard deviation of each of the magnetic field strengths collected through the magnetic field strength measuring unit 112. The standard deviation may compare a magnetic field strength at not only a specific group but all of the Hall elements 150. The magnetic standard deviation indicates the degree that the magnetic field strength collected from each of the at least one of Hall element 150 deviates from an average of the magnetic field strengths. When the number of Hall elements is four, the magnetic standard deviation may be calculated according to Mathematical Equation 2.

A range of threshold of the standard deviation (M_sd) may be changed based on the quantity and size of the magnet 210. The threshold may range from about 0 to about 0.5. That is, the threshold may be any value less than 0.5. When the standard deviation exceeds 0.5, it may be determined that the standard deviation does not satisfy a criterion.

$$M\_sd = \sqrt{(\text{variation})} \qquad \text{[Mathematical Equation 2]}$$

$$\text{Variation} = \frac{(HA - avg)^2 + (HB - avg)^2 + (HC - avg)^2 + (HD - avg)^2}{4}$$

$$Avg = \frac{(HA + HB + HC + HD)}{4}$$

Figure 5:
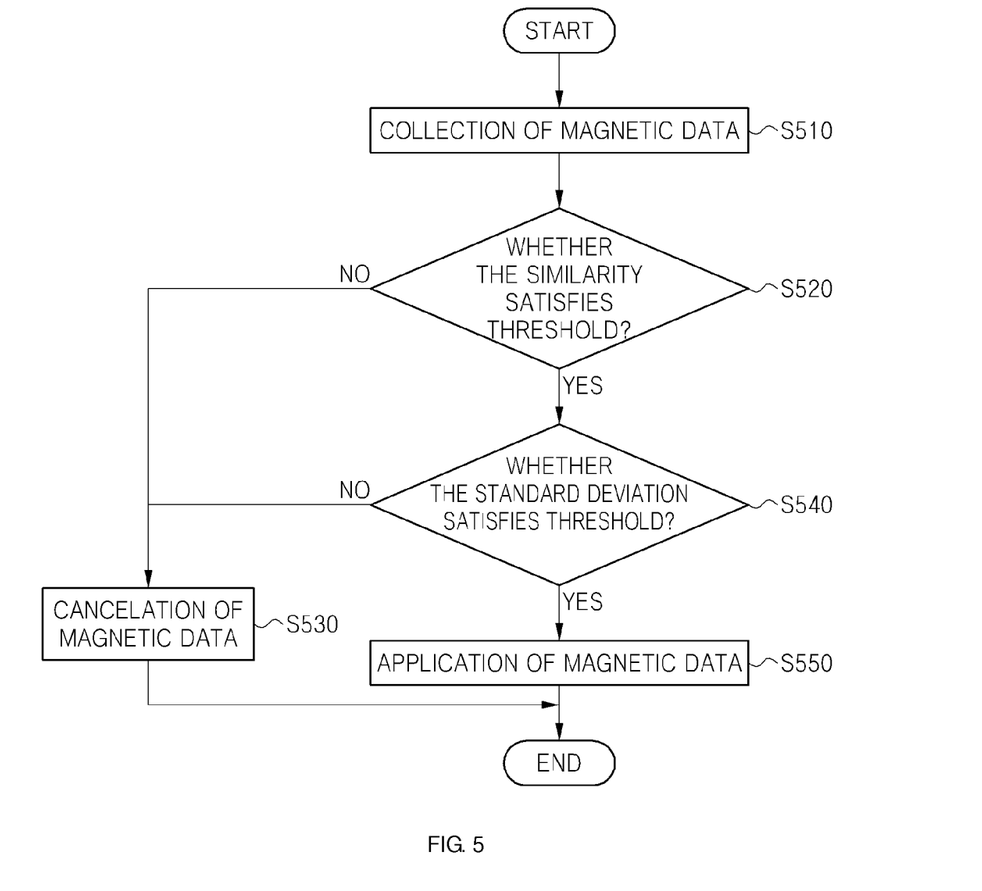
FIG. 5 is a diagram illustrating an example of the avoidance of sliding and a process of removing a horizontal sliding of a flip cover.
Figure 6:
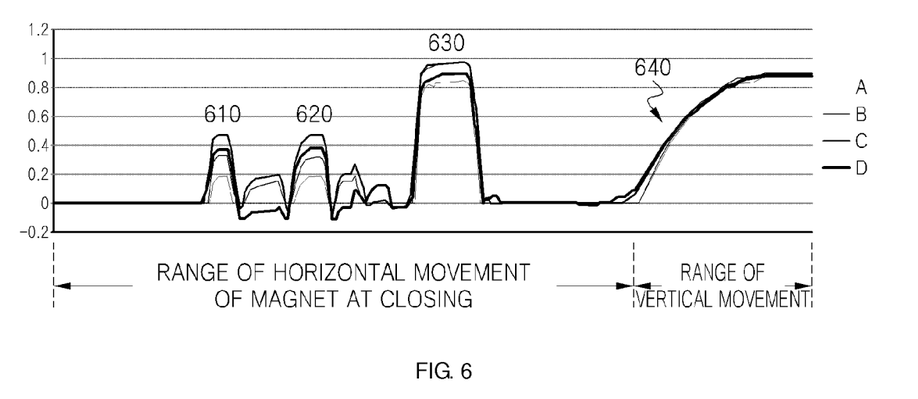
FIG. 6 is a diagram illustrating an example of a magnetic similarity and a magnetic standard deviation.
Figure 7:
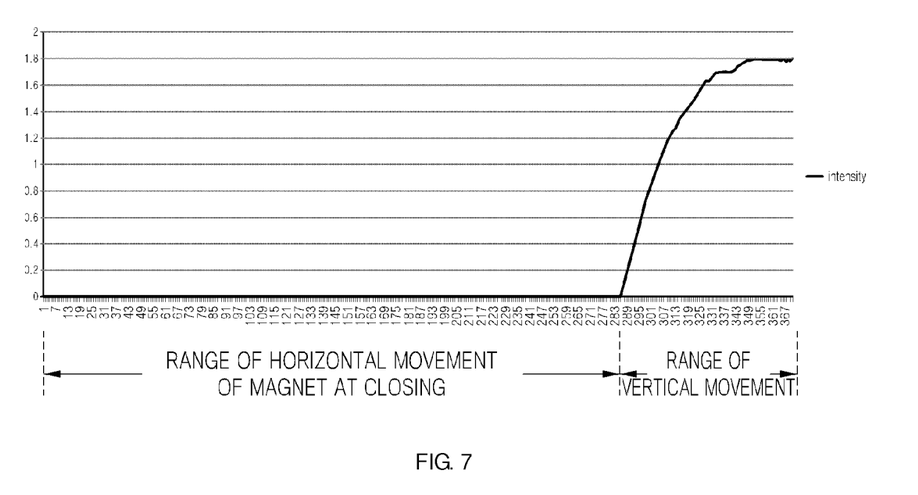
FIG. 7 is a diagram illustrating removing a variation of a magnetic field strength by generating a horizontal sliding of a flip cover.

M_sd: Standard Deviation
Variation: Dispersion of Magnetic Field Strength
Avg: Mathematical Average of Magnetic Field Strength
HA: Magnetic Field Strength of Hall Element A
HB: Magnetic Field Strength of Hall Element B
HC: Magnetic Field Strength of Hall Element C
HD: Magnetic Field Strength of Hall Element D 4: Total Quantity of Hall Elements The horizontal sliding determination unit 115 determines whether the horizontal sliding of the second body or the flip cover 200 from a surface of the first body or the terminal occurs. That is, the horizontal sliding determination unit 115 may determine whether the flip cover 200 horizontally slides based on the similarity measured by the similarity measuring unit 113 and the standard deviation measured by the standard deviation measuring unit 114. Therefore, when at least one of the value of the similarity and the value of the standard deviation satisfies a certain criterion, the flip cover 200 may be determine to be opened. An example of the horizontal sliding determination unit 115 is illustrated in FIG. 5 through FIG. 7.

The control unit 116 controls operation and flow of data of the group classification unit 111, the magnetic field strength measuring unit 112, the magnetic similarity measuring unit 113, the magnetic standard deviation measuring unit 114, the checking unit 117, and the horizontal sliding determination unit 115.

As illustrated in FIG. 3, the diagram describes an example of a measurement of the magnetic field strength generated by at least one Hall element.

Referring to FIG. 3a, the magnetic field strength measured by the magnetic field strength measuring unit 112 is constant at a maximum value of a certain level when the flip cover 200 is closed (a degree of 0). On the other hands, the magnetic field strength measured by the magnetic field strength measuring unit 112 exponentially decreases when the Hall sensor 110 is far from the magnet 210 of the flip cover 200 due to movement of the flip cover 200.

The distance between each of the at least one of the Hall elements 150 and the magnet 210 may be changed, and the maximum value of the magnetic field strength may be also changed when the flip cover 200 is closed (a degree of 0). The magnetic field strength 310 of the at least one Hall element 150 within a first distance near the magnet 210 may be stronger than the magnetic field strength 320 of the Hall element 150 within a second distance which is farther from the magnet 210. For example, in FIG. 4a, when Hall elements 150 are arranged at the corner of the rectangular Hall sensor 110, and the magnet 210 is arranged above the Hall sensor 110, a maximum value measured through the Hall elements 150a, 150b arranged on an upper side near the magnet 210 may be stronger than a maximum value measured through Hall elements 150c, 150d arranged on a lower side.

The similarity and the standard deviation is calculated using the value of the magnetic field strength, for a more accurate calculation. As FIG. 3b illustrates the value of the magnetic field strength collected by FIG. 3a may be used to determine a ratio of the distance of the magnet 210. A ratio of distance from the magnet 210 is calculated using the following Mathematical Equation 3 based on the magnetic field strength.

$$\text{Intensity\_}N = (\text{Raw\_0} - \text{Raw\_}N)/\text{Raw\_0} \quad \text{[Mathematical equation 3]}$$

Intensity_N: Ratio of distance between the magnets at an N degree angle

Raw_N: Magnetic field strength at N degrees

Raw_0: Magnetic field strength at 0 degrees

The ratio of distance from the magnet 210 may gradually increase as an open angle of the flip cover 200 increases. Therefore, the more the open angle increase, the more the ratio of distance from the magnet 210 converges to a certain value. The ratio of distance from the magnet 210 corresponds to a lineal distance from each of the Hall sensors 110 to the magnet 210. The ratio of distance from the magnet 210 may be calculated based on the magnetic field strength measured at each of the Hall elements. As FIG. 3b illustrates, when the flip cover 200 is nearly accessed by the Hall sensor 110, the ratio of distance from the magnet 210 is close to a value of 0. On the other hands, when the flip cover 200 is more open, the distance between the magnet 210 is lengthen more and more as detected by the far away Hall sensor 110. In this example, the ratio of distance from the magnet 210 is assumed to be close to a value of 1 when the open angle corresponds to a degree of 90.

A variation of the ratio of distance from the magnet 210 for each of the Hall sensors may be generated through a vertical and a horizontal movement of the flip cover 200. The variation of the magnetic field strength generated by a horizontal sliding of the flip cover 200 may be excluded when an open angle is calculated, so that accuracy of sensing movement of the flip cover 200 using the Hall sensors may increase. Because of malfunctioning resulting from horizontal sliding movements, opening the flip cover 200 may not be accurately sensed.

In FIG. 4, the diagram illustrates an example of a procedure of classifying at least one Hall element group.

Referring to FIG. 4, Hall elements 150 are assigned at each corner of the Hall sensor 110. In this example, one of the Hall elements 150 is arranged at each corner, but in other example, two or more of the Hall elements may be arranged at each corner. The more the quantity of the Hall elements increase, the more the accuracy is gradually increased. Accuracy may decrease according to a lower quantity of Hall elements leading to inaccurate sensing. The Hall element groups may each include at least one Hall element 150, and the Hall element groups may be set based on the distance between each of the Hall sensors 110 and the magnet 210.

In FIG. 4a, the magnetic field strength measuring unit 112 may be classified with a first Hall element group 410a and a second Hall element group 410b though the distance between the Hall sensor 110 and the magnet 210. As FIG. 4b illustrated, the diagram indicates when a position of the magnet 210 is changed due to a horizontal sliding.

FIG. 5 is a diagram illustrating an example of the avoidance of sliding and a process of removing a horizontal direction sliding of the flip cover 200.

Referring to FIG. 5, the group classification unit 111 may determine the Hall element groups. The magnetic field strength measuring unit 112 may measure the magnetic field strength generated by the magnet 210 of the flip cover 200 S510. The magnetic similarity measuring unit 113 may measure whether the magnetic field strength of the Hall elements 150 of a specific group is similar. The magnetic standard deviation measuring unit 114 may measure a standard deviation, which compares the magnetic field strength of each of the Hall elements 150 with the magnetic fields measured by all Hall elements.

The horizontal sliding determination unit 115 may determine whether a determined similarity satisfies a pre-determined value (threshold) S520. The threshold of similarity corresponds to a capable variation of the magnetic similarity, and the threshold may be a pre-fixed value related to the classification of the Hall element groups. For example, the threshold of the similarity of the horizontal sliding determination unit 115 may range from about 0.5 to about 1.5 (1±0.5). When the similarity exceeds 1.5 or is less than 0.5, it is determined that a horizontal sliding occurred. Also, when the similarity ranges from about 0.5 to about 1.5, a horizontal sliding is determined to have not occurred.

When the similarity is outside the threshold range, the horizontal sliding determination unit 115 may cancel the measured magnetic field strength S530. That is, the magnetic field strength may be determined to be a result of a horizontal sliding of the flip cover 200 and is excluded from the calculation of the angle of the flip cover 200.

When the similarity satisfies the threshold range, the horizontal sliding determination unit 115 may determine whether the flip cover 200 horizontally slides based on the standard deviation determined by the standard deviation measurement unit 114.

The horizontal sliding determination unit 115 may determine whether the standard deviation falls within the threshold range of the standard deviation S540. Herein, the threshold of the standard deviation is a capable range of the variation of the standard deviation, and the threshold may be a pre-fixed value related to a classification procedure of the Hall element group.

When the standard deviation satisfies the threshold range of the standard deviation, the horizontal sliding determination unit 115 may determine a normal operation of the magnetic field strength. In this example, the magnetic field strength may be determined by a magnetic field generated as a result of vertical sliding and not horizontal sliding. This magnetic field may be applied to a calculation for determining the angle of the flip cover 200 S550. On the other hands, when the standard deviation is outside the threshold range of the standard deviation, the magnetic field strength may be determined as resulting from a horizontal sliding of the flip cover 200 and cancelled from the calculation of the angle of the flip cover 200 S530. For example, the threshold of the standard deviation of the horizontal sliding determination unit 115 ranges from about 0.5 to about 1.5 (1±0.5). When the standard deviation exceeds 1.5 or is less than 0.5, the horizontal sliding is determined to have occurred. Also, when the similarity ranges from about 0.5 to about 1.5, the horizontal sliding is determined to have not occurred.

FIG. 6 is a graph illustrating an example of a magnetic similarity and a magnetic standard deviation.

Referring to FIG. 6, the ratio of the distance from the magnet 210 measured based on each of the magnetic field strength measured by the Hall elements 112 may be changed according to the movement of the horizontal sliding or the vertical sliding. Lines 610, 620 and 630 indicate when the horizontal sliding occurs. Therefore, all of the lines indicate results which do not satisfy the similarity and the standard deviation. The movement of the flip cover 200 determines the movement of the horizontal sliding to be excluded at the calculation of angle of the flip cover 200. On the other hands, the part shown within the range of vertical movement indicates a normal operation. The graph does not illustrate a large difference out of range of the similarity and the standard deviation. Herein, FIG. 6 indicates a range of normal opening of the flip cover 200. In the case, the horizontal sliding determination unit 115 applies the value of the magnetic field strength to calculate the open angle of the flip cover 200.

FIG. 7 is a graph illustrating an example of removing variation of the magnetic field strength by generating the horizontal direction sliding of the flip cover 200.

Referring to FIG. 7, when the horizontal sliding determination unit 115 determines the magnetic field strength generated by the horizontal sliding movement of the flip cover 200 based on the similarity and the standard deviation, the variation of the magnetic field strength may be excluded from the calculation of the angle at a certain range. On the other hands, when the horizontal sliding determination unit 115 satisfies the similarity and the standard deviation, the variation of the magnetic field strength may be determined as a the vertical movement of the flip cover 200, and the variation of the magnetic field strength may be included in the calculation of the angle of the flip cover 200. The vertical movement corresponds to the opening of the flip cover 200.

Accordingly, in various aspects, the Hall sensor 110 determines the data of the vertical movement of the flip cover 200 and excludes the variation of the magnetic field strength resulting from the horizontal sliding movement based on whether the flip cover 200 horizontally slides.

The display terminal 110 may calculate a variation of the angle and a moving distance of the flip cover 200 based on the data of the vertical movement determined by the Hall sensor 110, and the calculated result may be used to change a user interface (i.e. UI) or the setting of game data.

The various units, modules, elements, and methods described above may be implemented using one or more hardware components, one or more software components, or a combination of one or more hardware components and one or more software components.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of sensing, by a sensor, a movement in a first direction, comprising:
    arranging a first Hall element displaced in the first direction from a second Hall element;
    arranging a magnetic field source configured to generate a magnetic field;
    measuring the magnetic field at each of the first and second Hall elements; and
    comparing a strength of the magnetic field measured at the first Hall element to a strength of the magnetic field measured at the second Hall element; and
    determining whether the movement occurs,
    wherein the arranging of the first and the second Hall elements comprises arranging the first and second Hall elements on a first body,
    wherein the arranging of the magnetic field source comprises arranging the magnetic field source on a second body,
    wherein the determining whether the movement occurs comprises determining whether the second body moves in the first direction relative to the first body, and
    wherein the first body comprises a terminal comprising a sensor chip.

2. The method of claim 1, wherein the comparing the strength of the magnetic field comprises measuring a similarity of the magnetic field strength measured at the first Hall element and the magnetic field strength measured at the second Hall element.

3. The method of claim 2, wherein the measuring the similarity comprises determining a ratio of the magnetic field strength measured at the first Hall element to the magnetic field strength measured at the second Hall element.

4. The method of claim 3, wherein the comparing the magnetic field strength further comprises measuring a standard deviation of the magnetic field strength.

5. The method of claim 4, wherein the determining whether the movement occurs comprises determining that the second body does not change position in response to the measuring the similarity satisfying a threshold and the standard deviation satisfying a threshold.

6. The method of claim 4, wherein the determining whether the movement occurs further comprises determining that the second body changes position in response to one of the the similarity not satisfying a threshold and the standard deviation not satisfying a threshold.

7. The method of claim 3, wherein a threshold of the similarity ranges from about 0.5 to about 1.5.

8. The method of claim 4, wherein a threshold of the standard deviation ranges from about 0 to about 0.5.

9. The method of claim 1, wherein the second body comprises a flip cover comprising a magnet.

10. The method of claim 1, further comprising:
arranging a third Hall element displaced from a fourth Hall element in the first direction;
measuring a magnetic field strength at each of the third Hall element and the fourth Hall element.

* * * * *